United States Patent
Park et al.

(10) Patent No.: US 9,620,529 B2
(45) Date of Patent: Apr. 11, 2017

(54) DISPLAY SUBSTRATE AND METHOD OF MANUFACTURING THE SAME

(71) Applicant: Samsung Display Co., LTD., Yongin, Gyeonggi-Do (KR)

(72) Inventors: Jae-Hwa Park, Gumi-si (KR); Do-Yeong Park, Seoul (KR); Jun-Seok Lee, Seoul (KR); Ki-Pyo Hong, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 33 days.

(21) Appl. No.: 14/610,358

(22) Filed: Jan. 30, 2015

(65) Prior Publication Data
US 2015/0364495 A1    Dec. 17, 2015

(30) Foreign Application Priority Data

Jun. 13, 2014 (KR) .......................... 10-2014-0072204

(51) Int. Cl.
| | |
|---|---|
| *H01L 27/12* | (2006.01) |
| *H01L 29/786* | (2006.01) |
| *H01L 29/66* | (2006.01) |
| *H01L 21/465* | (2006.01) |
| *H01L 21/469* | (2006.01) |
| *H01L 21/4757* | (2006.01) |

(52) U.S. Cl.
CPC .......... *H01L 27/124* (2013.01); *H01L 21/465* (2013.01); *H01L 21/469* (2013.01); *H01L 21/47573* (2013.01); *H01L 27/127* (2013.01); *H01L 27/1225* (2013.01); *H01L 29/66969* (2013.01); *H01L 29/7869* (2013.01)

(58) Field of Classification Search
CPC .......................... H01L 27/124; H01L 27/1225
See application file for complete search history.

(56) References Cited

U.S. PATENT DOCUMENTS

| | | | |
|---|---|---|---|
| 2007/0166895 A1* | 7/2007 | Lee | G02F 1/13458 438/151 |
| 2008/0017886 A1* | 1/2008 | Chang | H01L 27/1255 257/203 |
| 2013/0112979 A1* | 5/2013 | Nam | G02F 1/136227 257/59 |
| 2013/0328050 A1 | 12/2013 | Higaki et al. | |

FOREIGN PATENT DOCUMENTS

| | | |
|---|---|---|
| KR | 10-2005-0068541 | 7/2005 |
| KR | 10-2007-0015075 | 2/2007 |
| KR | 10-2008-0040505 | 5/2008 |

* cited by examiner

*Primary Examiner* — Lex Malsawma
*Assistant Examiner* — Xia L Cross
(74) *Attorney, Agent, or Firm* — Innovation Counsel LLP

(57) ABSTRACT

A display substrate includes a gate line extending in a first direction, a floating electrode disposed on the same layer as the gate line, and a data line. Opposite ends of the floating electrode are electrically connected with the data line. The floating electrode extends in a second direction that crosses the first direction. The data line includes a recess disposed adjacent to the gate line. The data line overlaps with the floating electrode and also extends in the second direction.

10 Claims, 11 Drawing Sheets

DISPLAY SUBSTRATE AND METHOD OF MANUFACTURING THE SAME

PRIORITY STATEMENT

This application claims priority under 35 U.S.C. §119 to Korean Patent Application No. 10-2014-0072204, filed on Jun. 13, 2014 in the Korean Intellectual Property Office KIPO, the contents of which are herein incorporated by reference in their entireties.

BACKGROUND

1. Field

The present system and method relate to a display substrate and method of manufacturing the display substrate. More particularly, the present system and method relate to a display substrate for a liquid crystal display and method of manufacturing the display substrate.

2. Description of the Related Art

Generally, a liquid crystal display (LCD) panel includes a thin film transistor (TFT) substrate, an opposing substrate and an LC layer. The TFT substrate may include a plurality of gate lines, a plurality of data lines crossing the gate lines, a plurality of TFTs connected with the gate lines and data lines, and a plurality of pixel electrodes connected with the TFTs. Each TFT may include a gate electrode extended from a gate line, a source electrode extended from a data line, and a drain electrode spaced apart from the source electrode.

In the liquid crystal display, a charging rate may be decrease due to RC delay. Thus, the thickness of a wiring is sometimes increased to improve the charging rate. When the thickness of the wiring is increased, the resistance of the wiring is decreased, thereby reducing the effects of RC delay. However, when the thickness of the wiring is increased, the substrate on which the wiring is disposed may warp due to a difference in the expansion coefficients of the wiring and the substrate. When the substrate is warped, faults including stains may occur.

SUMMARY

Exemplary embodiments of the present system and method provide a display substrate that decreases the resistance of wirings on the substrate without additional processes.

Exemplary embodiments of the present system and method further provide a method of manufacturing the display substrate.

In an exemplary embodiment of the present system and method, a display substrate includes a gate line extending in a first direction, a floating electrode disposed on the same layer as the gate line, and a data line. Opposite ends of the floating electrode are electrically connected with the data line. The floating electrode extends in a second direction that crosses the first direction. The data line includes a recess disposed adjacent to the gate line. The data line overlaps with the floating electrode and also extends in the second direction.

In an exemplary embodiment, the display substrate may further include an organic layer disposed on the date line and a pixel electrode disposed on the organic layer.

In an exemplary embodiment, the display substrate may further include a connecting electrode that electrically connects the data line and the floating electrode.

In an exemplary embodiment, the connecting electrode and the pixel electrode may be formed from the same layer.

In an exemplary embodiment, the data line and the floating electrode may have a same width.

In an exemplary embodiment, the display substrate may further include an active pattern disposed under the data line. The floating electrode may be separated from the gate line.

In an exemplary embodiment of the present system and method, a display substrate includes a gate line extending in a first direction, a floating electrode disposed on the same layer as the gate line, an insulation layer disposed on the gate line and the floating electrode and a data line disposed on the insulation layer. The floating electrode extends in a second direction that crosses the first direction. The insulation layer exposes the floating electrode. The data line extends in the second direction. The data line is electrically connected with the floating electrode.

In an exemplary embodiment, the display substrate may further include an organic layer disposed on the date line and a pixel electrode disposed on the organic layer.

In an exemplary embodiment, the data line and the floating electrode may have a same width.

In an exemplary embodiment, a lower surface of the data line may be in direct contact with an upper surface of the floating electrode.

In an exemplary embodiment of the present system and method, a method of manufacturing a display substrate includes forming a gate metal layer on a base substrate, patterning the gate metal layer to form a gate line extending in a first direction and a floating electrode extending in a second direction that crosses the first direction, forming an active layer on the gate line and the floating electrode, forming a data metal layer on the active layer, patterning the active layer and the data metal layer to form a data line extending in the second direction and forming a connecting electrode that electrically connects the data line and the floating electrode. The data line includes a recess disposed adjacent to the gate line. The data line overlaps with the floating electrode.

In an exemplary embodiment, the method of manufacturing a display substrate may further include forming an organic layer disposed on the date line and forming a pixel electrode disposed on the organic layer.

In an exemplary embodiment, the connecting electrode and the pixel electrode may be formed from the same layer.

In an exemplary embodiment, the data line and the floating electrode may have a same width.

In an exemplary embodiment of the present system and method, a method of manufacturing a display substrate includes forming a gate metal layer on a base substrate, patterning the gate metal layer to form a gate line extending in a first direction and a floating electrode extending in a second direction that crosses the first direction, forming an insulation layer and an active layer on the gate line and the floating electrode, patterning the insulation layer and the active layer to form an active pattern and a contact hole exposing the floating electrode, forming a data metal layer on the insulation layer on which the active pattern is formed and patterning the data metal layer to form a data line electrically connected with the floating electrode. The data line extends in the second direction.

In an exemplary embodiment, the method of manufacturing a display substrate may further include forming an organic layer disposed on the date line and forming a pixel electrode disposed on the organic layer.

In an exemplary embodiment, the data line and the floating electrode may have a same width.

In an exemplary embodiment, a lower surface of the data line may be in direct contact with an upper surface of the floating electrode.

In an exemplary embodiment, the floating electrode may be separated from the gate line.

According to the embodiments of the present system and method, in a display apparatus, a floating electrode electrically connected with a data line is formed, so that the resistance of the data line may be decreased without increasing of width of the data line and without decreasing an aperture ratio of the display apparatus.

In addition, when the thickness of the data line is increased, a substrate on which a wiring is disposed may warp due to the different expansion coefficients of the wiring and the substrate. However, because the data line according to the present system and method has a low resistance without having to increase the thickness of the data line, faults due to increasing the thickness of data line may be prevented.

BRIEF DESCRIPTION OF THE DRAWINGS

The features and advantages of the present system and method are described in the exemplary embodiments below reference to the accompanying drawings, in which.

Figure 1:
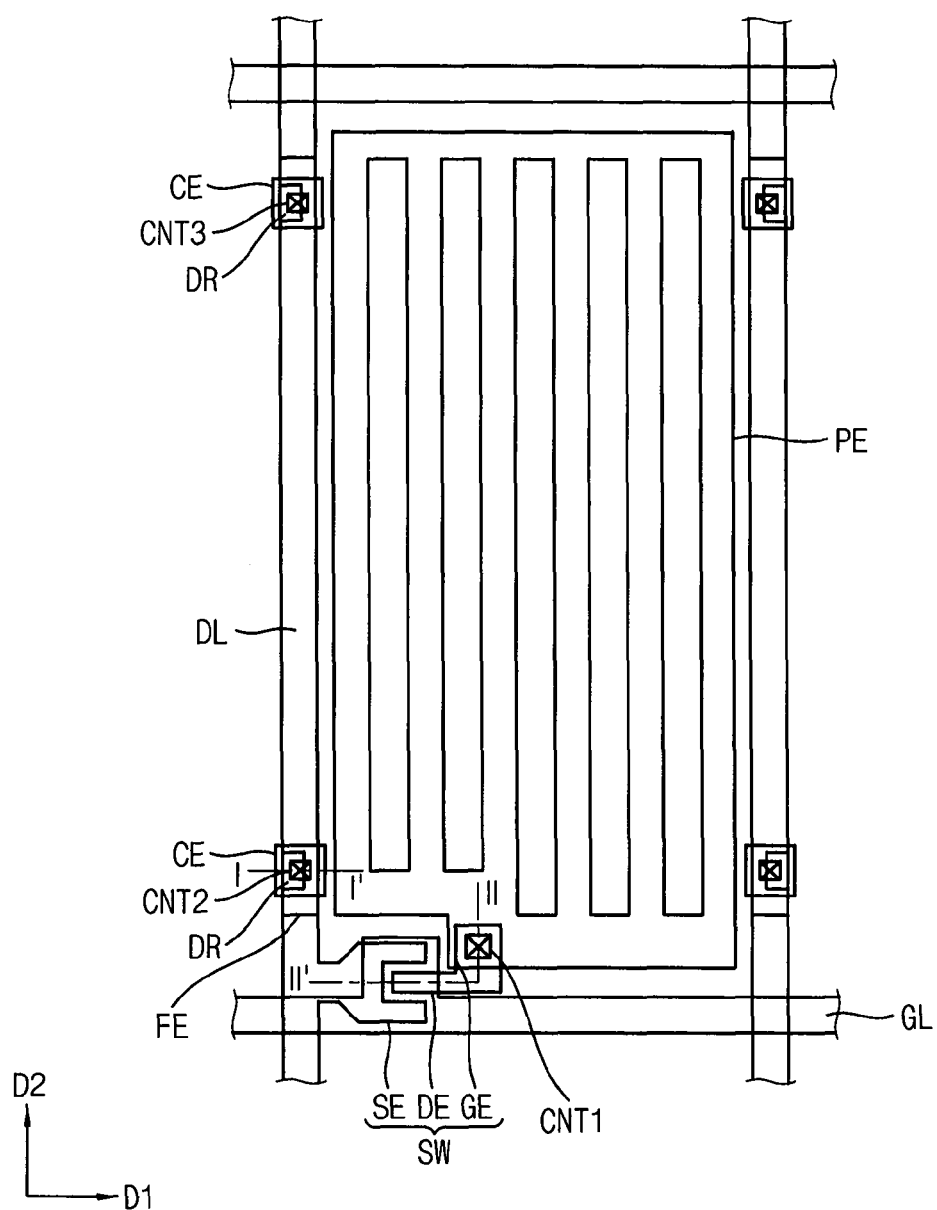
FIG. 1 is a plan view illustrating a display substrate according to an exemplary embodiment of the present system and method.

The figures in the drawings are not necessarily drawn to scale and are only intended to facilitate the description of the various embodiments described herein. The figures do not describe every aspect of the teachings disclosed herein and do not limit the scope of the claims.

DETAILED DESCRIPTION

Hereinafter, the present system and method are described with reference to the accompanying drawings. In the drawings, the thickness of layers, films, panels, regions, etc., may be exaggerated for clarity. Like reference numerals designate like elements throughout the specification. It is understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
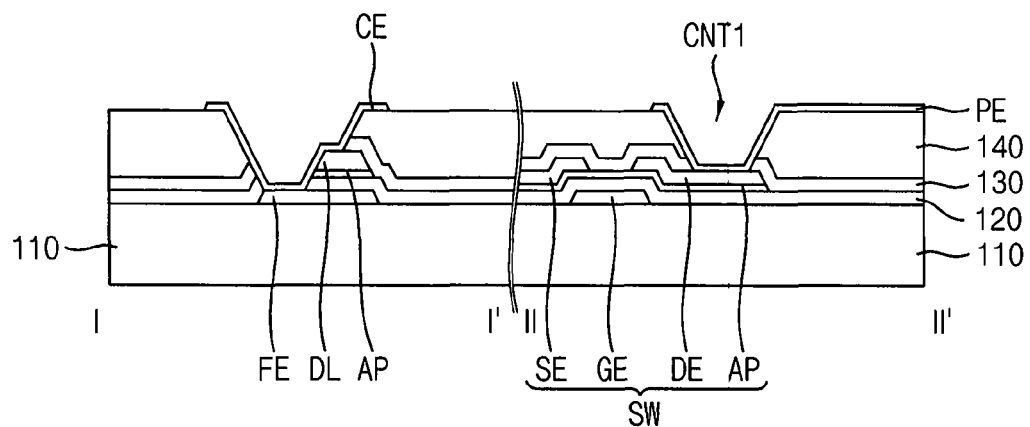
FIG. 2 is a cross-sectional view taken along a line I-I' and a line II-II' of FIG. 1.

FIG. 1 is a plan view illustrating a display substrate according to an exemplary embodiment of the present system and method. FIG. 2 is a cross-sectional view taken along a line I-I' and a line II-II' of FIG. 1.

Referring to FIGS. 1 and 2, a display substrate includes a base substrate 110, a gate line GL, a data line DL, a gate electrode GE, a source electrode SE, a drain electrode DE, an active pattern AP, a pixel electrode PE, a floating electrode FE, a first insulation layer 120, a second insulation layer 130, an organic layer 140 and a connecting electrode CE.

Examples of the base substrate 110 may include a glass substrate, a quartz substrate, a silicon substrate, a plastic substrate and the like.

The gate line GL is disposed on the base substrate 110. The gate line GL extends in a first direction D1. The gate line GL may have a single layer structure and include copper (Cu), silver (Ag), chrome (Cr), molybdenum (Mo), aluminum (Al), titanium (Ti), manganese (Mn) and a mixture thereof. In addition, the gate line GL may have a multilayer structure with a plurality of layers formed from an assortment of materials. For example, the gate line GL may include a copper layer and a titanium layer disposed on and/or under the copper layer.

The floating electrode FE is disposed on the base substrate 110. The floating electrode FE may be formed from the same layer as the gate line GL, but spaced apart from the gate line GL. The floating electrode FE may have a single layer structure and include copper (Cu), silver (Ag), chrome (Cr), molybdenum (Mo), aluminum (Al), titanium (Ti), manganese (Mn) and a mixture thereof. In addition, the floating electrode FE may have a multilayer structure with a plurality of layers formed from an assortment of materials. For example, the floating electrode FE may include a copper layer and a titanium layer disposed on and/or under the copper layer. The floating electrode FE may have a thickness of 6000 Å.

The gate electrode GE is disposed on the base substrate 110 and electrically connected with the gate line GL. The gate electrode GE may have a single layer structure and include copper (Cu), silver (Ag), chrome (Cr), molybdenum (Mo), aluminum (Al), titanium (Ti), manganese (Mn) and a mixture thereof. In addition, the gate electrode GE may have a multilayer structure with a plurality of layers formed from an assortment of materials. For example, the gate electrode GE may include a copper layer and a titanium layer disposed on and/or under the copper layer.

The first insulation layer 120 is formed on the gate electrode GE. The first insulation layer 120 may cover the base substrate 110 and a first conductive pattern including the gate electrode GE. The first insulation layer 120 may include an inorganic material such as silicon oxide (SiOx) and/or silicon nitride (SiNx). The first insulation layer 120 may have a thickness of about 500 Å. In addition, the first insulation layer 120 may include a plurality of layers formed from an assortment of materials.

The active pattern AP is formed on the first insulation layer 120. The active pattern AP is formed on the first insulation layer 120 in an area where the gate electrode GE is formed. The active pattern AP may overlap with the gate electrode GE. The active pattern AP may partially overlap with the source electrode SE and the drain electrode DE. The active pattern AP may be disposed between the gate electrode GE and the source electrode SE. The active pattern may be disposed between the gate electrode GE and the drain electrode DE.

The data line DL is formed on the active pattern AP. The data line DL extends in a second direction D2 that crosses the first direction D1. The data line DL may overlap with the floating electrode FE. The data line DL may have a recess disposed adjacent to the gate line GL. The data line DL may expose the floating electrode FE in a plan view. The data line DL may have the same width as the floating electrode FE. The data line DL may be electrically connected with the floating electrode FE, such as at opposite ends of the floating electrode FE. The data line DL may have a single layer structure and include copper (Cu), silver (Ag), chrome (Cr), molybdenum (Mo), aluminum (Al), titanium (Ti), manganese (Mn) and a mixture thereof. In addition, the data line DL may have a multilayer structure with a plurality of layers formed from an assortment of materials. For example, the data line DL may include a copper layer and a titanium layer disposed on and/or under the copper layer. The data line DL may have a thickness of 6000 Å.

The source electrode SE and the drain electrode DE may be formed on the active pattern AP. The source electrode SE and the drain electrode DE may be spaced apart from each other and formed from the same layer as the data line DL. The source electrode SE and the drain electrode DE may have a single layer structure and include copper (Cu), silver (Ag), chrome (Cr), molybdenum (Mo), aluminum (Al), titanium (Ti), manganese (Mn) and a mixture thereof. In addition, the source electrode SE and the drain electrode DE may have a multilayer structure with a plurality of layers formed from an assortment of materials. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material including silicon oxide (SiOx) or silicon nitride (SiNx).

The organic layer 140 is disposed on the second insulation layer 130. The organic layer 140 planarizes an upper surface of the substrate so that the uneven steps caused by the various structures do not lead to problems such as disconnection of a signal line. The organic layer 140 may be an insulation layer that includes an organic material. The organic layer 140 may further include a color filter (not shown).

The pixel electrode PE is formed on the organic layer 140. The pixel electrode PE may be electrically connected with the drain electrode DE, such as through a first contact hole CNT1. The pixel electrode PE may include a transparent conductive material, such as indium tin oxide (ITO) and indium zinc oxide (IZO). In addition, the pixel electrode PE may include titanium (Ti) and/or molybdenum titanium (MoTi).

The connecting electrode CE is formed on the organic layer 140. The connecting electrode CE electrically connects the data line DL and the floating electrode FE. The connecting electrode CE may be formed from the same layer as the pixel electrode PE. The connecting electrode CE may include a transparent conductive material, such as indium tin oxide (ITO) and indium zinc oxide (IZO). In addition, the connecting electrode CE may include titanium (Ti) and/or molybdenum titanium (MoTi). The connecting electrode CE may be electrically connected with the drain electrode DE.

As discussed earlier, one way to decrease the resistance of the data line DL is to increase its thickness. However, when the thickness of the data line DL is increased, the substrate may warp due to the different expansion coefficients of the wiring (e.g., the data line DL) and the substrate. In contrast, present system and method decrease the resistance of the data line DL without increasing the thickness of the data line. In particular, according to an exemplary embodiment, the data line DL may be electrically connected with the floating electrode FE at opposite ends of the floating electrode FE, thereby decreasing the resistance of the data line DL. Therefore, faults due to increasing a thickness of data line may be prevented by the present system and method.

FIGS. 3 to 8 are cross-sectional views that illustrate a method of manufacturing the display substrate of FIG. 2.

Figure 3:
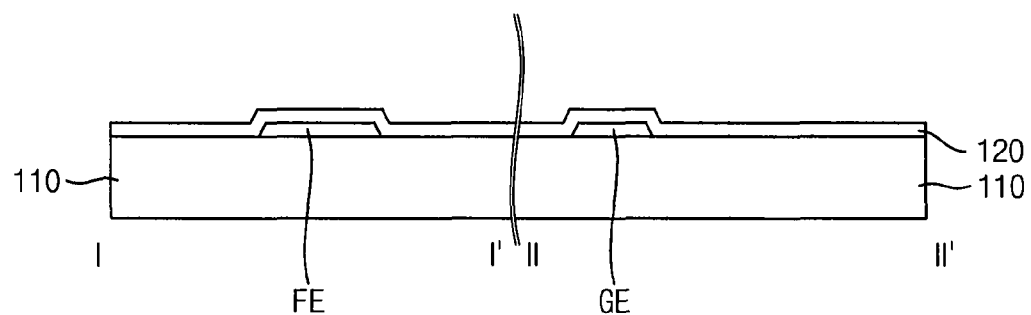
FIGS. 3, 4, 5, 6, 7, and 8 are cross-sectional views illustrating a method of manufacturing the display substrate of FIG. 2.

Referring to FIG. 3, the gate electrode GE and the floating electrode FE are formed on the base substrate 110. Thereafter, the first insulation layer 120 is formed on the base substrate 110, the gate electrode GE and the floating electrode FE.

The gate electrode GE and the floating electrode FE may be formed by patterning a first conductive layer. The first conductive layer may be formed through a sputtering process. The first conductive layer may have a single layer structure and include copper (Cu), silver (Ag), chrome (Cr), molybdenum (Mo), aluminum (Al), titanium (Ti), manganese (Mn) and a mixture thereof. In addition, the first conductive layer may have a multilayer structure with a plurality of layers formed from an assortment of materials. The first conductive layer may be a gate metal layer. In addition, the gate electrode GE and the floating electrode FE may be a gate metal pattern. The floating electrode FE may be formed from the same layer as the gate electrode GE. The floating electrode FE may have the same material as the gate electrode GE. The floating electrode FE may be spaced apart from the gate electrode GE.

The first insulation layer 120 is formed on the base substrate 110, the gate electrode GE and the floating electrode FE. The first insulation layer 120 may include an inorganic material such as silicon oxide (SiOx) and/or silicon nitride (SiNx). The first insulation layer may have a thickness of about 500 Å. In addition, the first insulation layer 120 may include a plurality of layers formed from an assortment of materials.

Figure 4:
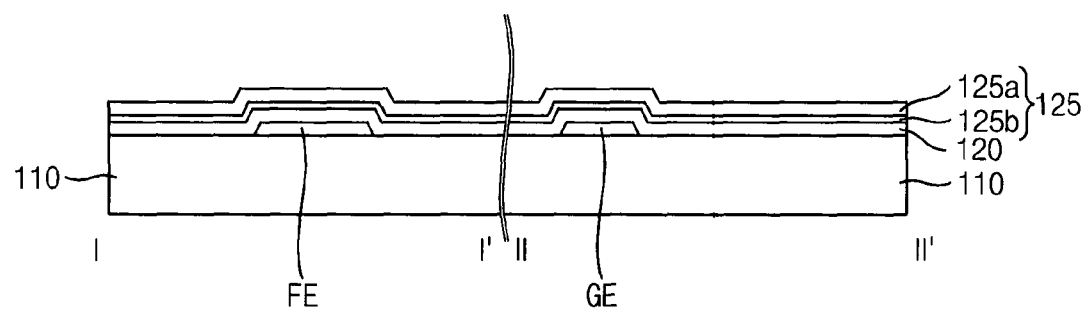

Referring to FIG. 4, a second conductive layer 125 may be formed on the base substrate 110 on which the gate insulation layer 120 is formed. The second conductive layer 125 may include a data metal layer 125a and a semiconductor layer 125b. The data metal layer 125a may include the source electrode SE and the drain electrode DE.

The data metal layer 125a may have a single layer structure and include copper (Cu), silver (Ag), chrome (Cr), molybdenum (Mo), aluminum (Al), titanium (Ti), manganese (Mn) and a mixture thereof. In addition, the data metal layer 125a may have a multilayer structure with a plurality of layers formed from an assortment of materials. For example, the data metal layer 125a may include a copper layer and a titanium layer disposed on and/or under the copper layer.

The semiconductor layer 125b may include an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These materials may be used each alone or in a combination thereof.

Figure 5:
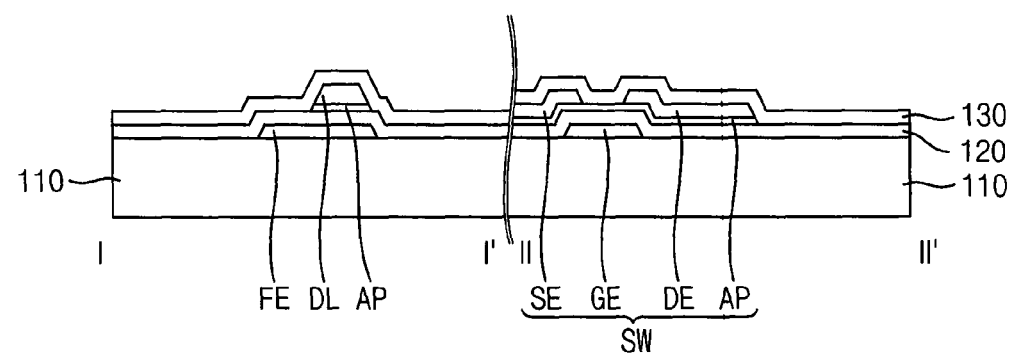

Referring to FIG. 5, the source electrode SE, the drain electrode DE and the data line DL are formed by patterning the second conductive layer 125. Thereafter, the second insulation layer 130 is formed on the base substrate 110 on which the source electrode SE, the drain electrode DE and the data line DL are formed.

The source electrode SE and the drain electrode DE may have a single layer structure and include copper (Cu), silver (Ag), chrome (Cr), molybdenum (Mo), aluminum (Al), titanium (Ti), manganese (Mn) and a mixture thereof. In addition, the source electrode SE and the drain electrode DE may have a multilayer structure with a plurality of layers formed from an assortment of materials. For example, the source electrode SE and the drain electrode DE may include a copper layer and a titanium layer disposed on and/or under the copper layer.

Referring to FIGS. 1 and 5, the data line DL may overlap with the floating electrode FE. The data line DL may have a recess disposed adjacent to the gate line GL. The data line DL may expose the floating electrode FE in a plan view. The data line DL may have the same width as the floating electrode FE. The data line DL may be electrically connected with the floating electrode FE, such as at opposite ends of the floating electrode FE. The data line DL may have a single layer structure and include copper (Cu), silver (Ag), chrome (Cr), molybdenum (Mo), aluminum (Al), titanium (Ti), manganese (Mn) and a mixture thereof. In addition, the data line DL may have a multilayer structure with a plurality of layers formed from an assortment of materials. For example, the data line DL may include a copper layer and a titanium layer disposed on and/or under the copper layer. The data line DL may have a thickness of 6000 Å.

The second insulation layer 130 may be formed on the source electrode SE and the drain electrode DE. The second insulation layer 130 may be formed with a material including silicon oxide (SiOx) or silicon nitride (SiNx).

Figure 6:
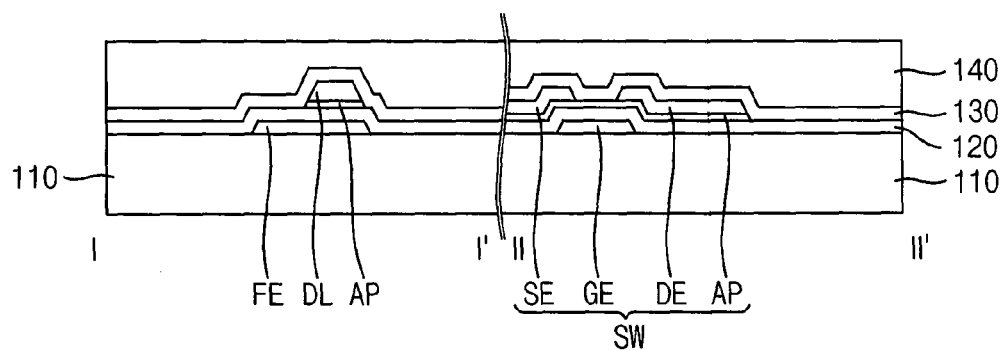

Referring to FIG. 6, the organic layer 140 is disposed on the second insulation layer 130. The organic layer 140 planarizes an upper surface of the substrate so that the uneven steps caused by the various structures do not lead to problems such as disconnection of a signal line. The organic layer 140 may be an insulation layer and include an organic material. The organic layer 140 may further include a color filter (not shown).

Figure 7:
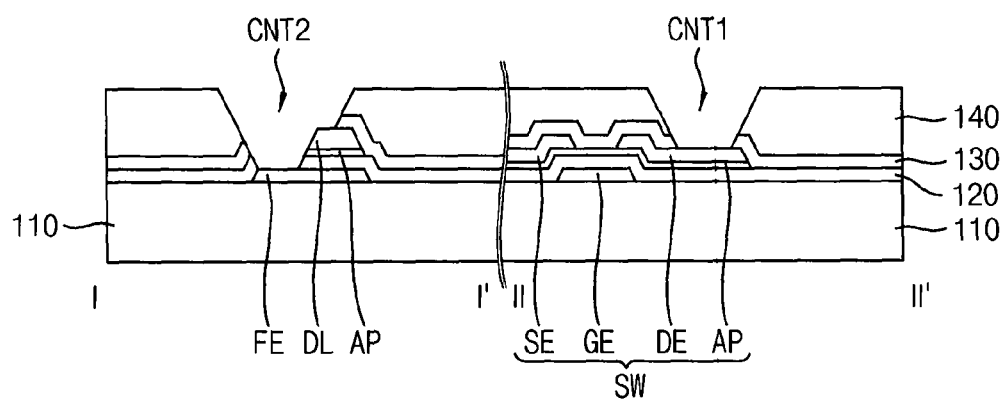

Referring to FIG. 7, the first insulation layer 120, the second insulation layer 130 and the organic layer 140 are patterned such that the floating electrode FE, the data line DL and the drain electrode DE are partially exposed. Particularly, a first contact hole CNT1 is formed through the organic layer 140 and the second insulation layer 130 so that the first contact hole CNT1 partially exposes the drain electrode DE. A second contact hole CNT2 is formed through the organic layer 140, the second insulation layer 130 and the first insulation layer 120 so that the second contact hole CNT2 partially exposes a portion of the floating electrode FE and a portion of the data line DL.

Referring to FIG. 1, the recess DR may overlap with opposite ends of the floating electrode FE. The data line DL may have two recesses DR in one unit pixel. The recess DR may expose a portion of the floating electrode FE in a plan view. The exposed floating electrode FE may be electrically connected with the data line DL.

Figure 8:
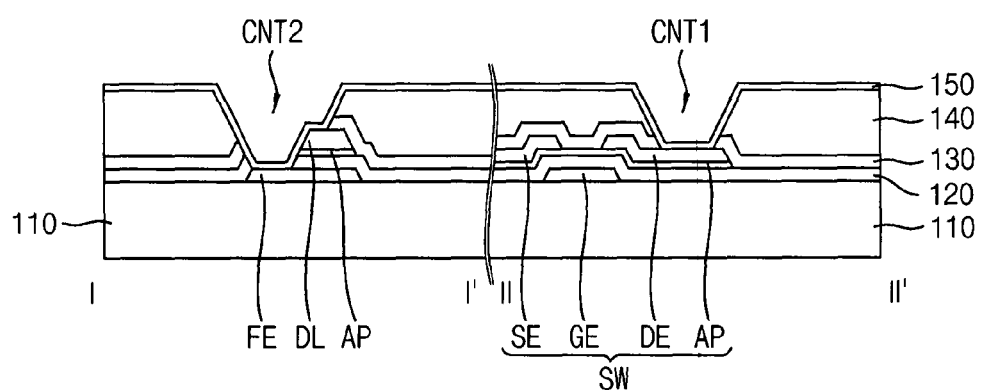

Referring to FIG. 8, a transparent conductive layer 150 is formed on the patterned organic layer 140. The transparent conductive layer 150 may include a transparent conductive material, such as indium tin oxide (ITO) and indium zinc oxide (IZO). In addition, the transparent conductive layer 150 may include titanium (Ti) and/or molybdenum titanium (MoTi). The transparent conductive layer 150 may be electrically connected with the drain electrode DE. The transparent conductive layer 150 is patterned to form the pixel electrode PE and the connecting electrode CE, as shown in FIG. 2.

The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE. The pixel electrode PE may be electrically connected with the drain electrode DE through the first contact hole CNT1.

The connecting electrode CE may connect the data line DL and the floating electrode FE through the second contact hole CNT2. The connecting electrode CE may be formed from the same layer as the pixel electrode PE. The connecting electrode CE may include a transparent conductive material, such as indium tin oxide (ITO) and indium zinc oxide (IZO). In addition, the connecting electrode CE may include titanium (Ti) and/or molybdenum titanium (MoTi).

Figure 9:
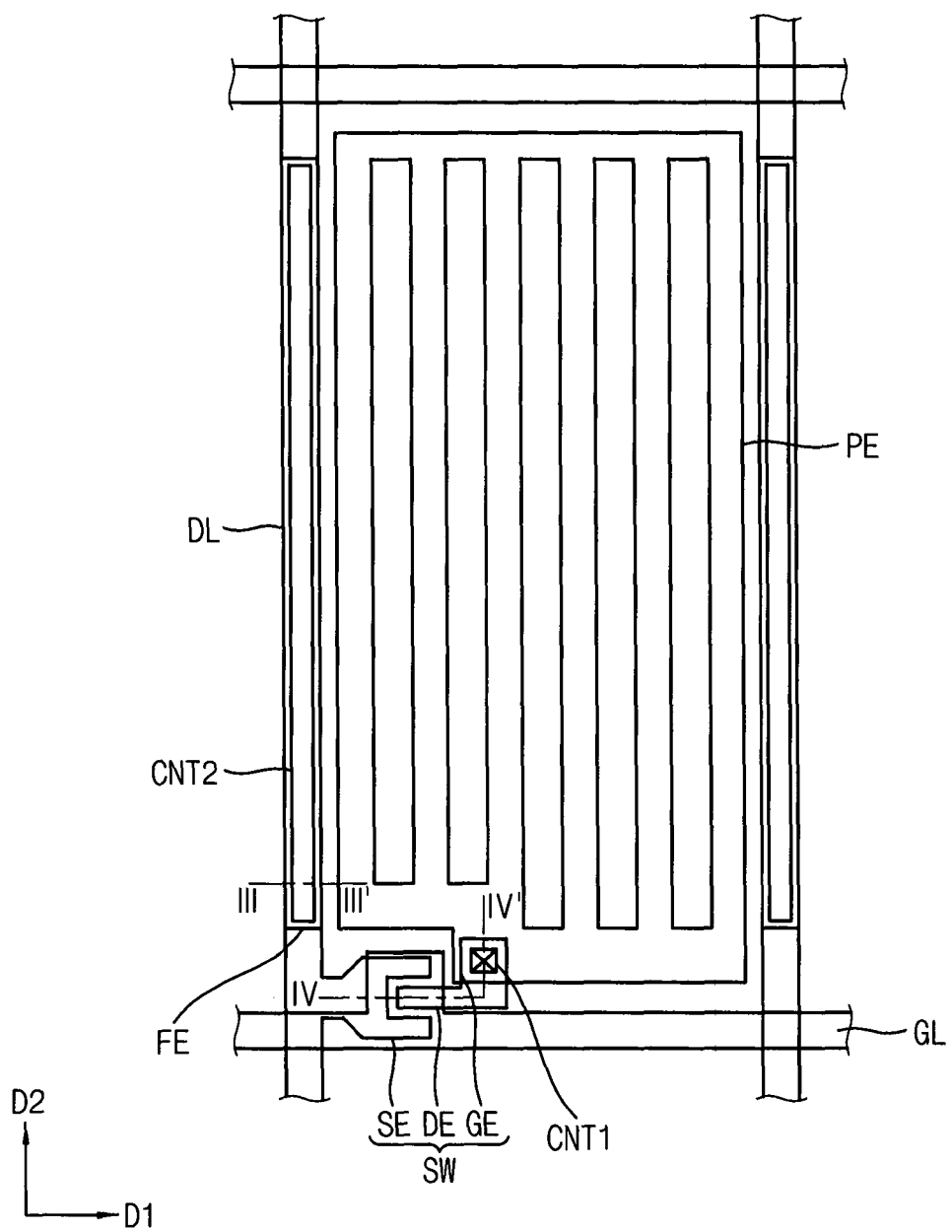
FIG. 9 is a plan view illustrating a display substrate according to an exemplary embodiment of the present system and method.
Figure 10:
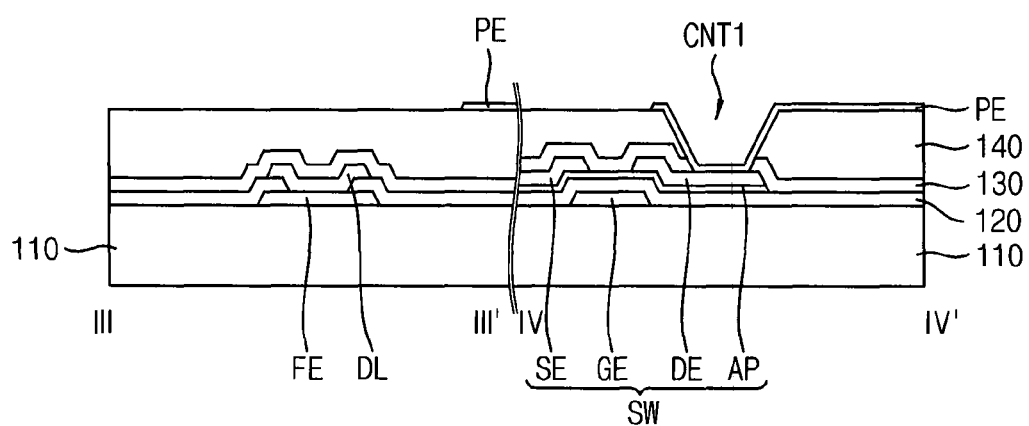
FIG. 10 is a cross-sectional view taken along a line III-III' and a line IV-IV' of FIG. 9.

FIG. 9 is a plan view illustrating a display substrate according to an exemplary embodiment of the present system and method. FIG. 10 is a cross-sectional view taken along a line III-III' and a line IV-IV' of FIG. 9.

Referring to FIGS. 9 and 10, a display substrate includes a base substrate 110, a gate line GL, a data line DL, a gate electrode GE, a source electrode SE, a drain electrode DE, an active pattern AP, a pixel electrode PE, a floating electrode FE, a first insulation layer 120, a second insulation layer 130 and an organic layer 140.

Examples of the base substrate 110 may include a glass substrate, a quartz substrate, a silicon substrate, a plastic substrate and the like.

The gate line GL is disposed on the base substrate 110 and extends in a first direction D1. The gate line GL may have a single layer structure and include copper (Cu), silver (Ag), chrome (Cr), molybdenum (Mo), aluminum (Al), titanium (Ti), manganese (Mn) and a mixture thereof. In addition, the gate line GL may have a multilayer structure with a plurality of layers formed from an assortment of materials. For example, the gate line GL may include a copper layer and a titanium layer disposed on and/or under the copper layer.

The floating electrode FE is disposed on the base substrate 110. The floating electrode FE may be formed from the same layer as the gate line GL, but spaced apart from the gate line GL. The floating electrode FE may have a single layer structure and include copper (Cu), silver (Ag), chrome (Cr), molybdenum (Mo), aluminum (Al), titanium (Ti), manganese (Mn) and a mixture thereof. In addition, the floating electrode FE may have a multilayer structure with a plurality of layers formed from an assortment of materials. For example, the floating electrode FE may include a copper layer and a titanium layer disposed on and/or under the copper layer. The floating electrode FE may have a thickness of 6000 Å.

The gate electrode GE is disposed on the base substrate 110. The gate electrode GE is electrically connected with the gate line GL. The gate electrode GE may have a single layer structure and include copper (Cu), silver (Ag), chrome (Cr), molybdenum (Mo), aluminum (Al), titanium (Ti), manganese (Mn) and a mixture thereof. In addition, the gate electrode GE may have a multilayer structure with a plurality of layers formed from an assortment of materials. For example, the gate electrode GE may include a copper layer and a titanium layer disposed on and/or under the copper layer.

The first insulation layer 120 is formed on the gate electrode GE. The first insulation layer 120 may cover the base substrate 110 and a first conductive pattern including the gate electrode GE. The first insulation layer 120 may include an inorganic material such as silicon oxide (SiOx) and/or silicon nitride (SiNx). The first insulation layer 120 may have a thickness of about 500 Å. In addition, the first insulation layer 120 may include a plurality of layers formed from an assortment of materials.

The active pattern AP is formed on the first insulation layer 120. The active pattern AP is formed on the first insulation layer 120 in an area where the gate electrode GE is formed. The active pattern AP may overlap with the gate electrode GE. The active pattern AP may partially overlap with the source electrode SE and the drain electrode DE. The active pattern AP may be disposed between the gate electrode GE and the source electrode SE. The active pattern may be disposed between the gate electrode GE and the drain electrode DE. Unlike the embodiment shown in FIG. 2, the active pattern AP is not formed in a region where the data line DL is formed in the embodiment of FIG. 10. That is, in this case, the active pattern AP is not formed under the data line DL.

Figure 13:
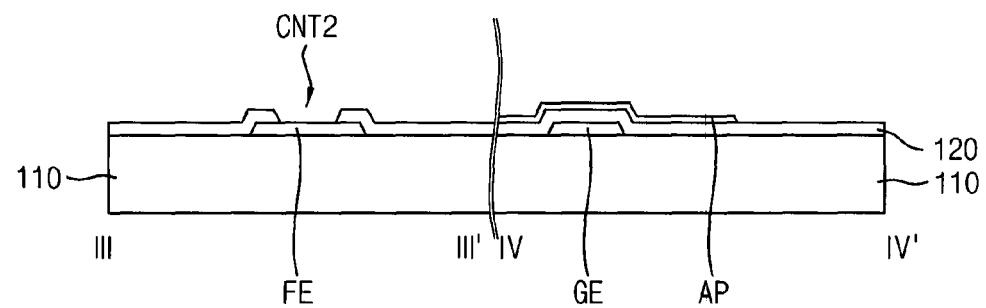

In a process of forming the active pattern AP, the first insulation layer 120 disposed on the floating electrode FE is removed, so that a second contact hole CNT2 is formed on the floating electrode FE, such as shown in FIG. 13.

The data line DL is formed on the base substrate 110 where the floating electrode is exposed by the second contact hole CNT2. The data line DL extends in a second direction D2 that crosses the first direction D1. The data line DL may overlap with the floating electrode FE. The data line DL may have the same width as the floating electrode FE. The data line DL may be electrically connected with the floating electrode FE through the second contact hole CNT2. The data line DL may have a single layer structure and include copper (Cu), silver (Ag), chrome (Cr), molybdenum (Mo), aluminum (Al), titanium (Ti), manganese (Mn) and a mixture thereof. In addition, the data line DL may have a multilayer structure with a plurality of layers formed from an assortment of materials. For example, the data line DL may include a copper layer and a titanium layer disposed on and/or under the copper layer. The data line DL may have a thickness of 6000 Å.

The source electrode SE and the drain electrode DE may be formed on the active pattern AP. The source electrode SE and the drain electrode DE may be spaced apart from each other. The source electrode SE and the drain electrode DE may be formed from the same layer as the data line DL.

The source electrode SE and the drain electrode DE may have a single layer structure and include copper (Cu), silver (Ag), chrome (Cr), molybdenum (Mo), aluminum (Al), titanium (Ti), manganese (Mn) and a mixture thereof. In addition, the source electrode SE and the drain electrode DE may have a multilayer structure with a plurality of layers formed from an assortment of materials. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material including silicon oxide (SiOx) or silicon nitride (SiNx).

The organic layer 140 is disposed on the second insulation layer 130. The organic layer 140 planarizes an upper surface of the substrate so that the uneven steps caused by the various structures do not lead to problems such as disconnection of a signal line. The organic layer 140 may be an insulation layer and include an organic material. The organic layer 140 may further include a color filter (not shown).

The pixel electrode PE is formed on the organic layer 140. The pixel electrode PE may be electrically connected with the drain electrode DE through a first contact hole CNT1. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE.

As discussed earlier, one way to decrease the resistance of the data line DL is to increase its thickness. However, when the thickness of the data line DL is increased, the substrate may warp due to the different expansion coefficients of the wiring (e.g., the data line DL) and the substrate. In contrast, present system and method decrease the resistance of the data line DL without increasing the thickness of the data line. In particular, according to an exemplary embodiment, the data line DL may be electrically connected with the floating electrode FE through the second contact hole CNT2 (see FIG. 10) such that a lower surface of the data line DL is directly connected with an upper surface of the floating electrode FE, thereby decreasing the resistance of the data line DL. Therefore, faults due to increasing a thickness of data line may be prevented.

FIGS. 11 to 18 are cross-sectional views illustrating a method of manufacturing the display substrate of FIG. 9.

Figure 11:
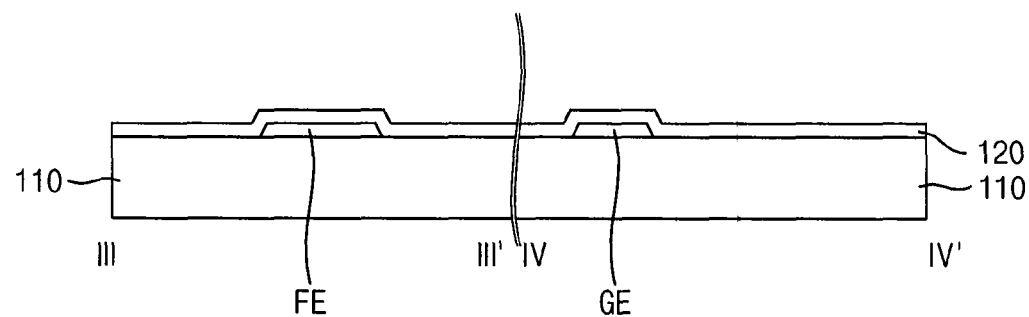
FIGS. 11, 12, 13, 14, 15, 16, 17 and 18 are cross-sectional views illustrating a method of manufacturing the display substrate of FIG. 9.

Referring to FIG. 11, the gate electrode GE and the floating electrode FE are formed on the base substrate 110. Thereafter, the first insulation layer 120 is formed on the base substrate 110, the gate electrode GE and the floating electrode FE.

The gate electrode GE and the floating electrode FE may be formed by patterning a first conductive layer. The first conductive layer may be formed through a sputtering process. The first conductive layer may have a single layer structure and include copper (Cu), silver (Ag), chrome (Cr), molybdenum (Mo), aluminum (Al), titanium (Ti), manganese (Mn) and a mixture thereof. In addition, the first conductive layer may have a multilayer structure with a plurality of layers formed from an assortment of materials. The first conductive layer may be a gate metal layer. In addition, the gate electrode GE and the floating electrode FE may be a gate metal pattern. The floating electrode FE may be formed from the same layer as the gate electrode GE. The floating electrode FE may have the same material as the gate electrode GE. The floating electrode FE may be spaced apart from the gate electrode GE.

The first insulation layer 120 is formed on the base substrate 110, the gate electrode GE and the floating electrode FE. The first insulation layer 120 may include an inorganic material such as silicon oxide (SiOx) and/or silicon nitride (SiNx). The first insulation layer may have a thickness of about 500 Å. In addition, the first insulation layer 120 may include a plurality of layers formed from an assortment of materials.

Figure 12:
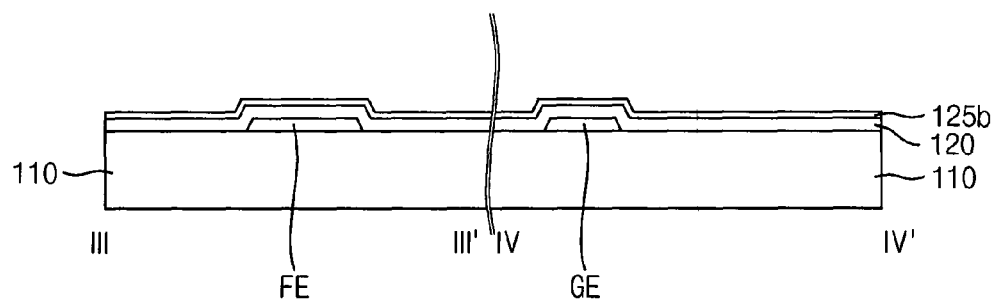

Referring to FIG. 12, a semiconductor layer 125b may be formed on the base substrate 110 on which the gate insulation layer 120 is formed. The semiconductor layer 125b may be patterned to form the active pattern AP, such as shown in FIG. 13.

The semiconductor layer 125b may include an oxide semiconductor. For example, the oxide semiconductor may include zinc oxide ("ZnO"), zinc tin oxide ("ZTO"), indium zinc oxide ("IZO"), indium oxide ("InO"), titanium oxide ("TiO"), indium gallium zinc oxide ("IGZO"), indium zinc tin oxide ("IZTO") or the like. These materials may be used each alone or in a combination thereof.

The active pattern AP is formed on the first insulation layer 120. The active pattern AP is formed on the first insulation layer 120 in an area where the gate electrode GE is formed. The active pattern AP may overlap with the gate electrode GE. Unlike the embodiment shown in FIG. 2, the active pattern AP is not formed in a region where the data line DL is formed. That is, in the embodiment of FIG. 10, the active pattern AP is not formed under the data line DL.

In a process of forming the active pattern AP, the first insulation layer 120 disposed on the floating electrode FE is removed, so that a second contact hole CNT2 is formed on the floating electrode FE.

Figure 14:
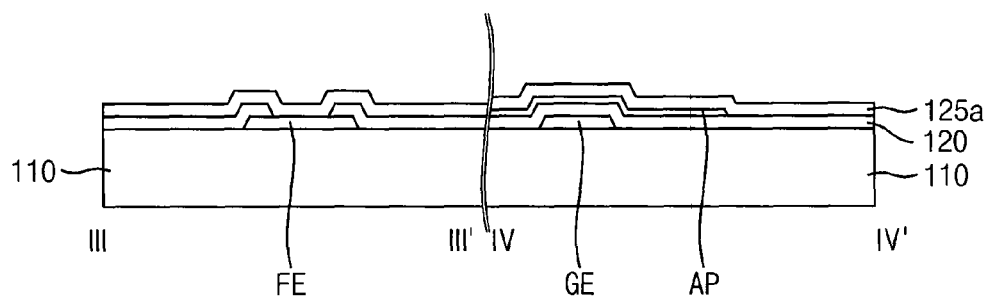

Referring to FIG. 14, a data metal layer 125a may be formed on the base substrate 110 where the active pattern AP is formed.

The data metal layer 125a may have a single layer structure and include copper (Cu), silver (Ag), chrome (Cr), molybdenum (Mo), aluminum (Al), titanium (Ti), manganese (Mn) and a mixture thereof. In addition, the data metal layer 125a may have a multilayer structure with a plurality of layers formed from an assortment of materials. For example, the data metal layer 125a may include a copper layer and a titanium layer disposed on and/or under the copper layer.

Figure 15:
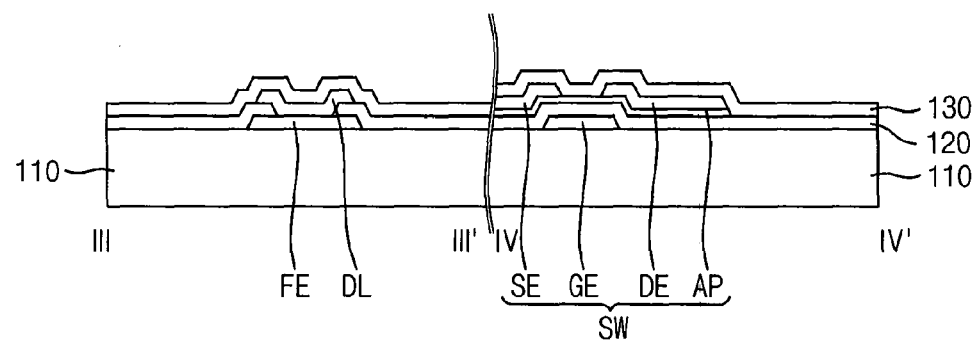

Referring to FIG. 15, the source electrode SE, the drain electrode DE and the data line DL are formed by patterning the data metal layer 125a. Thereafter, the second insulation layer 130 is formed on the base substrate 110 on which the source electrode SE, the drain electrode DE and the data line DL are formed.

The source electrode SE and the drain electrode DE may have a single layer structure and include copper (Cu), silver (Ag), chrome (Cr), molybdenum (Mo), aluminum (Al), titanium (Ti), manganese (Mn) and a mixture thereof. In addition, the source electrode SE and the drain electrode DE may have a multilayer structure with a plurality of layers formed from an assortment of materials. For example, the source electrode SE and the drain electrode DE may include a copper layer and a titanium layer disposed on and/or under the copper layer. According to an exemplary embodiment, the source electrode SE and the drain electrode DE are formed by using a mask that is different from the mask that was used for the active pattern AP. Therefore, the ends of the source electrode SE and the drain electrode DE may not correspond to ends of the active pattern AP.

Referring to FIGS. 9 and 15, the data line DL is formed on the base substrate 110 where the floating electrode FE is formed. The data line DL extends in a second direction D2 that crosses the first direction D1. The data line DL may overlap with the floating electrode FE. The data line DL may have the same width as the floating electrode FE. The data line DL may be electrically connected with the floating electrode FE through the second contact hole CNT2. The data line DL may have a single layer structure and include copper (Cu), silver (Ag), chrome (Cr), molybdenum (Mo), aluminum (Al), titanium (Ti), manganese (Mn) and a mixture thereof. In addition, the data line DL may have a multilayer structure with a plurality of layers formed from an assortment of materials. For example, the data line DL may include a copper layer and a titanium layer disposed on and/or under the copper layer. The data line DL may have a thickness of 6000 Å.

The second insulation layer 130 may be formed on the source electrode SE and the drain electrode DE. The second insulation layer 130 may be formed with a material including silicon oxide (SiOx) or silicon nitride (SiNx).

Figure 16:
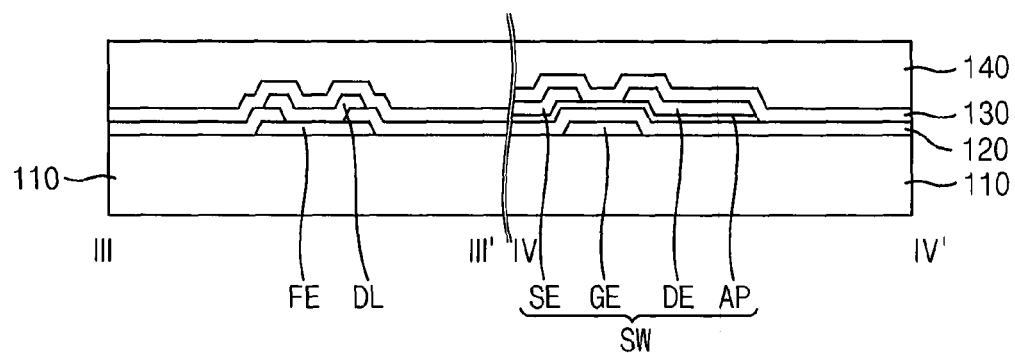

Referring to FIG. 16, the organic layer 140 is disposed on the second insulation layer 130. The organic layer 140 planarizes an upper surface of the substrate so the uneven steps caused by the various structures do not lead to problems such as disconnection of a signal line. The organic layer 140 may be an insulation layer and include an organic material. The organic layer 140 may further include a color filter (not shown).

Figure 17:
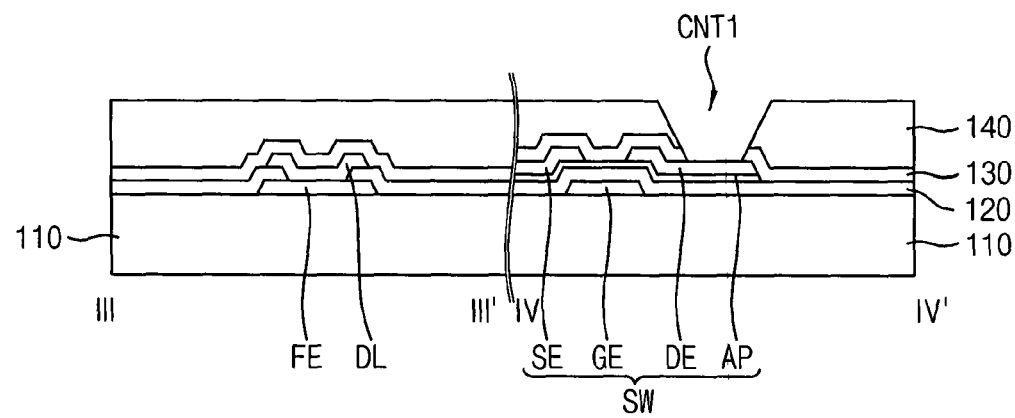

Referring to FIG. 17, the second insulation layer 130 and the organic layer 140 are patterned such that the drain electrode DE is partially exposed. That is, a first contact hole CNT1 is formed through the organic layer 140 and the second insulation layer 130, so that the first contact hole CNT1 partially exposes the drain electrode DE.

Figure 18:
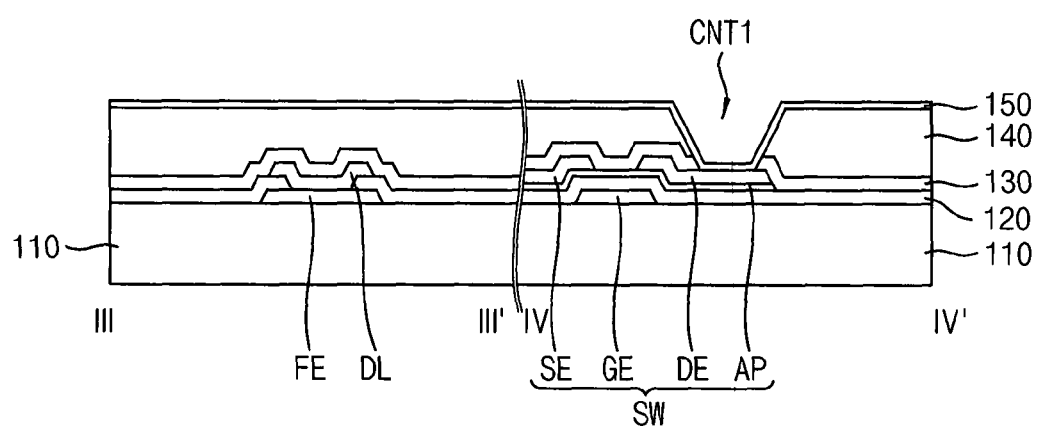

Referring to FIG. 18, a transparent conductive layer 150 is formed on the patterned organic layer 140. The transparent conductive layer 150 may include a transparent conductive material, such as indium tin oxide (ITO) and indium zinc oxide (IZO). In addition, the transparent conductive layer 150 may include titanium (Ti) and/or molybdenum titanium (MoTi).

Referring to FIG. 10, the transparent conductive layer 150 is patterned to form the pixel electrode PE and the connecting electrode CE. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may be electrically connected with the drain electrode DE. The pixel electrode PE may be electrically connected with the drain electrode DE through the first contact hole CNT1.

According to the embodiments of the present system and method described above, in a display apparatus, a floating electrode electrically connected with a data line is formed, so that the resistance of the data line may be decreased without increasing the width of the data line and without decreasing an aperture ratio of the display apparatus.

As discussed earlier, when the thickness of the data line is increased, the substrate on which the data line is disposed may warp due to the different expansion coefficients of the data line and the substrate. However, because the data line according to the present system and method has a low resistance without having to increase its thickness, faults due to increasing the thickness of the data line may be prevented.

The foregoing is illustrative of the present system and method and is not limiting thereof. Although exemplary embodiments of the present system and method are described, those skilled in the art would understand that various modifications are possible in the exemplary embodiments without departing from the novel teachings and advantages of the present system and method. Accordingly, all such modifications are intended to be included within the scope of the present system and method.

What is claimed is:
1. A display substrate comprising:
two gate lines extending in a first direction;
a floating electrode disposed on the same layer as the two gate lines, and extending in a second direction that crosses the first direction; and
a data line extending in the second direction, and having a recess disposed adjacent to at least one of the two gate lines, and overlapping with the floating electrode, and
wherein opposite ends of the floating electrode are electrically connected with the data line, and the floating electrode is disposed between the two gate lines.
2. The display substrate of claim 1, further comprising:
an organic layer disposed on the date line; and a pixel electrode disposed on the organic layer.
3. The display substrate of claim 2, further comprising:
a connecting electrode electrically connecting the data line and the floating electrode.

4. The display substrate of claim 3, wherein the connecting electrode and the pixel electrode are formed from the same layer.

5. The display substrate of claim 3, wherein the data line and the floating electrode have a same width.

6. The display substrate of claim 1, further comprising:
an active pattern disposed under the data line, and
wherein the floating electrode is separated from the two gate lines.

7. A display substrate comprising:
two gate lines extending in a first direction;
a floating electrode disposed on the same layer as the two gate lines, and extending in a second direction that crosses the first direction; an insulation layer disposed on the two gate lines and the floating electrode, and exposing the floating electrode; and
a data line disposed on the insulation layer, and extending in the second direction, and electrically connected with the floating electrode wherein the floating electrode is disposed between the two gate lines.

8. The display substrate of claim 7, further comprising:
an organic layer disposed on the date line; and
a pixel electrode disposed on the organic layer.

9. The display substrate of claim 7, wherein the data line and the floating electrode have a same width.

10. The display substrate of claim 7, wherein a lower surface of the data line is in direct contact with an upper surface of the floating electrode.

* * * * *